United States Patent
Xie et al.

(10) Patent No.: US 9,858,364 B2
(45) Date of Patent: Jan. 2, 2018

(54) COMPUTING DEVICE AND METHOD FOR PROCESSING POINT CLOUDS

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Peng Xie, Shenzhen (CN); Chih-Kuang Chang, New Taipei (TW); Xin-Yuan Wu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 641 days.

(21) Appl. No.: 14/514,616

(22) Filed: Oct. 15, 2014

(65) Prior Publication Data

US 2015/0106064 A1  Apr. 16, 2015

(30) Foreign Application Priority Data

Oct. 16, 2013 (CN) .......................... 2013 1 0483737

(51) Int. Cl.
*G06F 17/50* (2006.01)

(52) U.S. Cl.
CPC ................ *G06F 17/5009* (2013.01)

(58) Field of Classification Search
CPC ............... G06F 17/50; G06F 17/5009
USPC ......................................... 703/1, 6
See application file for complete search history.

(56) References Cited

U.S. PATENT DOCUMENTS 9,317,735 B2 * 4/2016 Watanabe .......... G06K 9/00201

FOREIGN PATENT DOCUMENTS

| CN | 102306397 A | 1/2012 |
| CN | 102944174 A | 2/2013 |
| TW | 201013446 A | 4/2010 |

* cited by examiner

*Primary Examiner* — Andy Ho
(74) *Attorney, Agent, or Firm* — ScienBiziP, P.C.

(57) ABSTRACT

A computing device and a method processes a point cloud of an object. The computing device constructs a curved surface according to the point cloud and triangulates the curved surface using a plurality of triangles. The computing device simulates each marked adjacent point and neighborhood points to a predetermined surface using a predetermined algorithm. The computing device projects each marked adjacent point onto a predetermined surface to obtain a projected point according to the type of the marked adjacent point.

20 Claims, 4 Drawing Sheets

COMPUTING DEVICE AND METHOD FOR PROCESSING POINT CLOUDS

CROSS-REFERENCE TO RELATED APPLICATIONS

This application claims priority to Chinese Patent Application No. 201310483737.9 filed on Oct. 16, 2013, the contents of which are incorporated by reference herein.

FIELD

The present disclosure relates to simulation technology, and particularly to a computing device and a method for processing point clouds of an object.

BACKGROUND

Point clouds are created by a measurement device, such as, a three-dimensional scanner. The measurement device measures a large number of points to generate point clouds by scanning a surface of an object (e.g., a component of a mobile phone). The point cloud represents the set of points that the measurement device has measured. However, the point cloud may include some points which locate at error positions.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
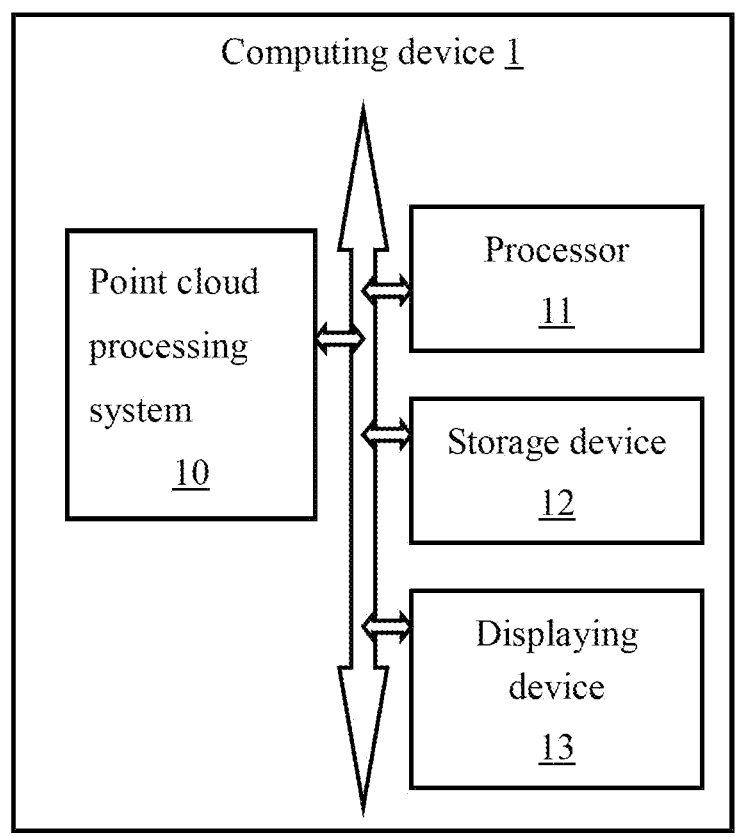
FIG. 1 is a block diagram of an example embodiment of a computing device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented. The term "module" refers to logic embodied in computing or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY™, flash memory, and hard disk drives. The term "comprising" means "including, but not necessarily limited to"; it specifically indicates open-ended inclusion or membership in a so-described combination, group, series and the like.

FIG. 1 illustrates a block diagram of an example embodiment of a computing device 1. In the example embodiment, the computing device 1 includes, but is not limited to, a point cloud processing system 10, at least one processor 11, and a storage device 12. The computing device 1 can further include a displaying device 13. In other embodiment, the computing device 1 can provide various functional connections to connect with the displaying device 13. In addition, the computing device 1 provides various functional connections to connect with an input device (e.g., a keyboard and a mouse).

The computing device 1 provides a user interface, which is displayed on the displaying device 13. One or more operations of the computing device 1 can be controlled by a user through the user interface. For example, the user may input an ID and a password using the input device into the user interface to access the computing device 1. The storage device 12 stores point clouds of an object. The object may be, but is not limited to, a component (e.g., a shell) of an electronic device (e.g., a mobile phone). The point clouds are three-dimensional. That is, each point in the point clouds includes an X-axis value, a Y-axis value and a Z-axis value. The displaying device 13 further displays the point clouds of the object, so that the point clouds of the object can be visually checked by the user. The computing device 1 can be, but is not limited to, a tablet computer, a server, a personal computer, a programmable logic controller (PLC), a measurement machine (e.g., a computerized numerical control machine, CNC machine), a scanner or any other computing device. The scanner can be, but is not limited to, a three-dimensional scanner capable of emitting light which is projected onto the object, so that the object can be scanned by the scanner. FIG. 1 illustrates only one example of the computing device 1, and other examples can comprise more or fewer components than those shown in the embodiment, or have a different configuration of the various components.

In at least one embodiment, the storage device 12 can be an internal storage device, such as a flash memory, a random access memory (RAM) for temporary storage of information, and/or a read-only memory (ROM) for permanent storage of information. The storage device 12 can also be an external storage device, such as an external hard disk, a storage card, or a data storage medium. The at least one processor 11 can be a central processing unit (CPU), a microprocessor, or other data processor chip that performs functions of the computing device 1. The point cloud processing system 10 is used to process the point clouds of the object. Detailed descriptions of the method for processing the point clouds of the object are given below in reference to FIG. 4.

Figure 2:
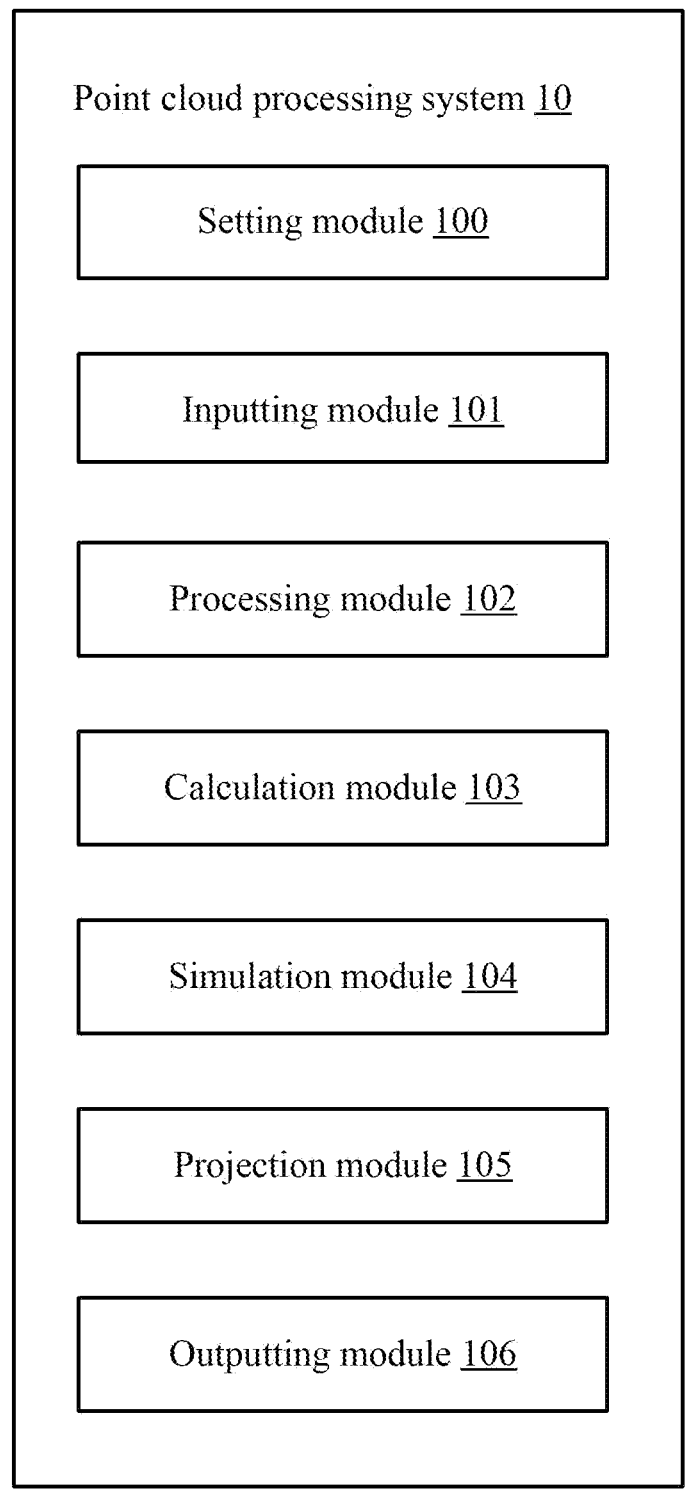
FIG. 2 is a block diagram of an example embodiment of a point cloud processing system included in the computing device.

FIG. 2 illustrates a block diagram of an example embodiment of the point cloud processing system 10 included in the computing device 1. In at least one embodiment, the point cloud processing system 10 can include, but is not limited to, a setting module 100, an inputting module 101, a processing module 102, a calculation module 103, a simulation module 104, a projection module 105, and an outputting module 106. The modules 100-106 can comprise computerized instructions in the form of one or more computer-readable programs that can be stored in a non-transitory computer-readable medium, such as the storage device 12, and be executed by the at least one processor 11 of the computing device 1. Detailed descriptions of functions of the modules are given below in reference to FIG. 4.

Figure 4:
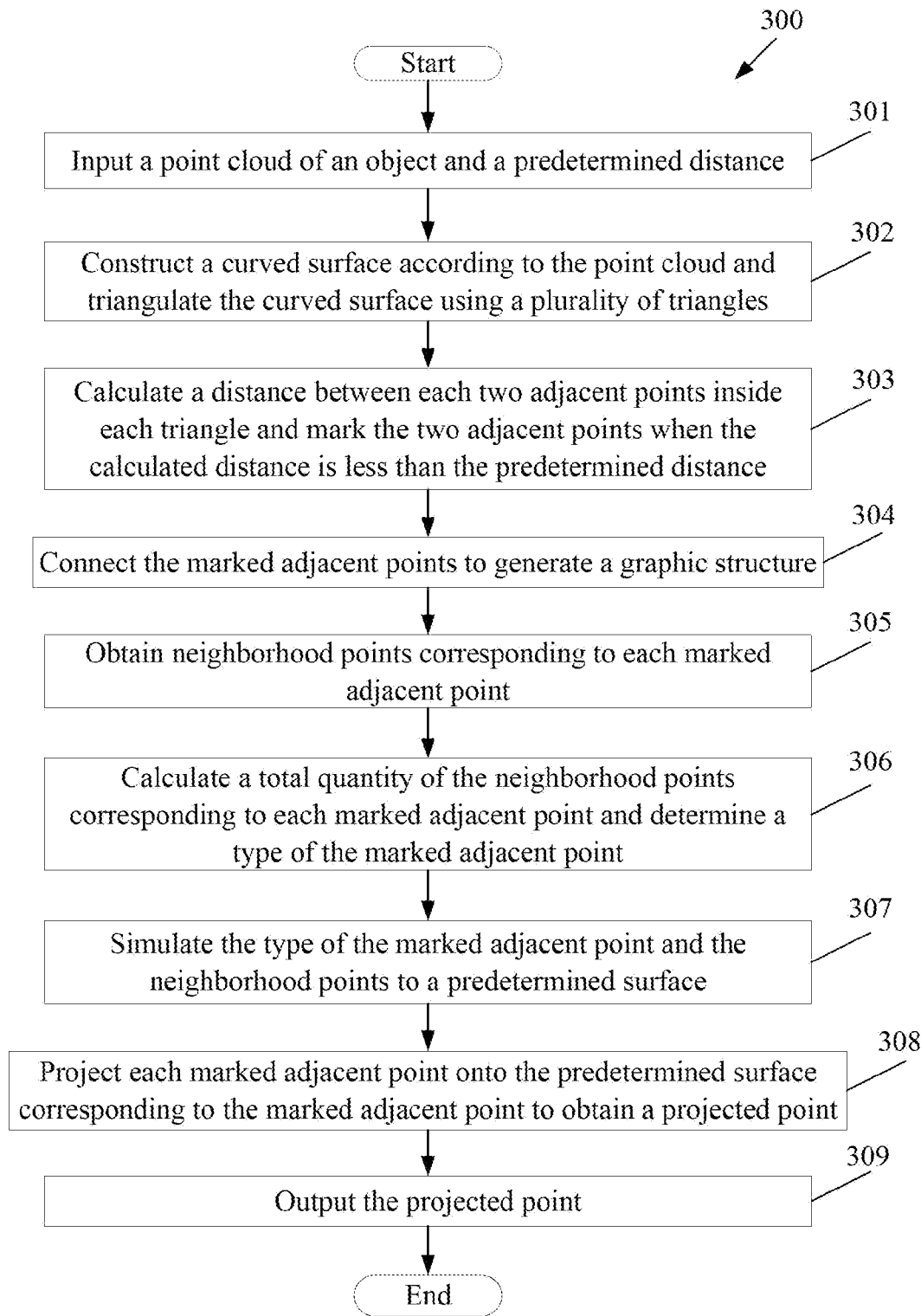
FIG. 4 is a flowchart of an example embodiment of a method for processing a point cloud of an object.

FIG. 4 illustrates a flowchart of an example embodiment of a method for processing point clouds. In an example embodiment, the method is performed by execution of computer-readable software program codes or instructions by at least one processor of a computing device.

Referring to FIG. 4, a flowchart is presented in accordance with an example embodiment. The method 300 is provided by way of example, as there are a variety of ways to carry out the method. The method 300 described below can be carried out using the configurations illustrated in FIGS. 1 and 2, for example, and various elements of these figures are referenced in explaining example method 300. Each block shown in FIG. 4 represents one or more processes, methods, or subroutines, carried out in the method 300. Furthermore, the illustrated order of blocks is illustrative only and the order of the blocks can be changed. Additional blocks can be added or fewer blocks may be utilized without departing from this disclosure. The example method 300 can begin at block 301.

In block 301, the obtaining module 101 obtains data of a point cloud of the object and a predetermined distance value from the storage device 12. The predetermined distance value is inputted by the setting module 100 using an inputting device and saved into the storage device 12. In at least one embodiment, the data of the point cloud of the object includes coordinates of each point in the point cloud, a mark of each point in the point cloud, a total quantity of the points in the point cloud. The predetermined distance value is dynamically changed according to a predetermined rule (e.g., an average distance of all points in the point cloud).

In block 302, the processing module 102 constructs a curved surface according to the point cloud and triangulates the curved surface using a plurality of triangles. In at least one embodiment, the curved surface can be represented by the plurality of triangles after triangulation.

In block 303, the calculation module 103 calculates a distance between each two adjacent points located inside each triangle and marks the two adjacent points when the calculated distance is less than the predetermined distance value. In at least one embodiment, the point in the point cloud is determined to be an adjacent point when the point is located inside a triangle of the curved surface. Assuming that the triangle A includes two adjacent points a1 and a2, if the distance between the two points a1 and a2 is less than the predetermined distance value, then the two adjacent points a1 and a2 are marked.

In block 304, the processing module 102 connects the marked adjacent points to generate a graphic structure of the point cloud of the object. In one embodiment, the marked adjacent points are connected using lines or curves, for example.

In block 305, the processing module 102 determines neighborhood points corresponding to each marked adjacent point. The neighborhood point is defined as a point which is connected to the marked adjacent point. Each marked adjacent point includes one or more neighborhood points. For example, if ten points are connected to the marked adjacent point a1, all ten points are determined to be the neighborhood points corresponding to the marked adjacent point a1.

In block 306, the calculation module 103 calculates a total quantity of the neighborhood points corresponding to each marked adjacent point, and determines a type of the marked adjacent point according to the calculated total quantity. The type of the marked adjacent point can be, but is not limited to, a surface type, a line type, an angle type, or an isolated type. If the type of the marked adjacent point is the surface type, the marked adjacent is used to simulate a plane surface. If the type of the marked adjacent point is the line type, the marked adjacent is used to simulate a conical surface. If the type of the marked adjacent point is the angle type, the marked adjacent is used to simulate a cylinder. In the embodiment, the calculation module 103 can define a first predetermined value, a second predetermined value and a third predetermined value. The first predetermined value (e.g., nine) is greater than the second predetermined value (e.g., six), and the second predetermined value is greater than the third predetermined value (e.g., one).

In one embodiment, if the calculated total quantity is greater than or equal to a first predetermined value (e.g., nine), the type of the marked adjacent point is determined to be the surface type. If the calculated total quantity is less than the first predetermined value (e.g., nine), and greater than or equal to a second predetermined value (e.g., six), the type of the marked adjacent point is determined to be the line type. If the calculated total quantity is less than the second predetermined value (e.g., six), and greater than a third predetermined value (e.g., one), the type of the marked adjacent point is determined to be the angle type. If the calculated total quantity is equal to the third predetermined value (e.g., one), the type of the marked adjacent point is determined to be the isolated type. If the type of the marked adjacent point is determined to be the isolated type, the marked adjacent point can be deleted or kept according to a desired need of the user. The first predetermined value is greater than the second predetermined value which is greater than the third predetermined value. The first predetermined value, the second predetermined value, and third predetermined value are preset by the setting module 100. In addition, three or more predetermined values (e.g., four predetermined values) are available for determining the type of the marked adjacent point.

In block 307, the simulation module 104 simulates the type of the marked adjacent point and the neighborhood points to a predetermined surface using a predetermined algorithm. The predetermined algorithm can be, but is not limited to, a triangulation algorithm, a least square method, a singular value decomposition (SVD) method, or a quaternion algorithm. The predetermined surface can be, but is not limited to, a plane surface, a conical surface, or a cylinder.

In block 308, the projection module 105 projects each marked adjacent point onto a predetermined surface corresponding to the marked adjacent point to obtain a projected point according to the type of the marked adjacent point. In one embodiment, the marked adjacent point is connected to the predetermined surface using a vertical line which is vertical to the predetermined surface. The interchange point between the vertical line and the predetermined surface is the projected point.

In block 309, the outputting module 106 outputs the projected point in the displaying device 13. Furthermore, the processing module 102 constructs a new surface using a plurality of the projected points and triangulates the new surface using a plurality of the triangles.

Figure 3:
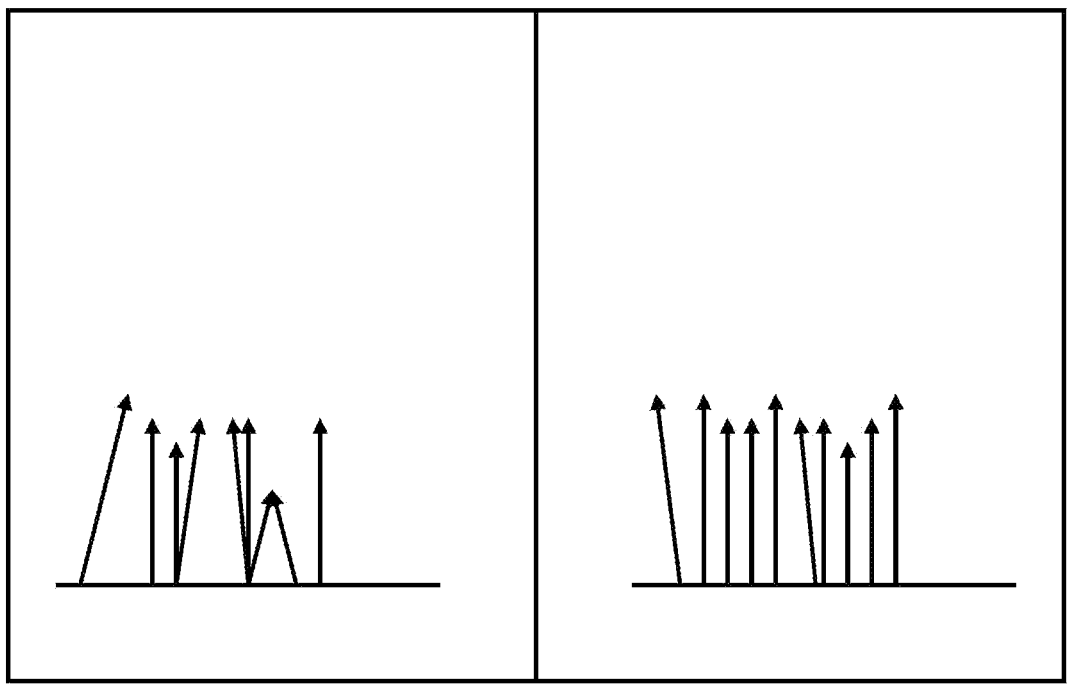
FIG. 3 is a diagrammatic view of an example of a graph illustrating normal vectors of points in the point cloud and another graph illustrating vectors of the projected points.

In other blocks, the processing module 102 also determines normal vectors of all projected points, and generates a graph which shows the normal vectors of all projected points. As shown in FIG. 3, the left graph shows the normal vectors of all points in the point cloud, and the right graph shows the normal vectors of all projected points after all points in the point cloud are processed into the projected points. The outputting module 106 further outputs the left graph and the right graph to the displaying device 13. Effect of processing the point cloud of the object can be visually checked by viewing the left graph and the right graph as shown in FIG. 3.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in particular the matters of shape, size and arrangement of parts within the principles of the present disclosure, up to and including the full extent established by the broad general meaning of the terms used in the claims.

What is claimed is:

1. A computing device, comprising:
   at least one processor; and
   a storage device storing one or more programs which, when executed by the at least one processor, cause the at least one processor to:
   retrieve from the storage device, data of a point cloud of an object;
   construct a curved surface according to the point cloud and triangulate the curved surface using a plurality of triangles;
   calculate a distance between each two adjacent points located inside each triangle and mark the two adjacent points when the calculated distance is less than a predetermined distance value;
   connect the marked adjacent points and generate a graphic structure of the point cloud of the object;
   determine neighborhood points corresponding to each marked adjacent point;
   calculate a total quantity of the neighborhood points corresponding to each marked adjacent point, and determine a type of the marked adjacent point according to the calculated total quantity;
   simulate each marked adjacent point and the neighborhood points to a predetermined surface using a predetermined algorithm according to the type of the marked adjacent point; and
   project each marked adjacent point onto the predetermined surface corresponding to the marked adjacent point to obtain a projected point according to the type of the marked adjacent point.

2. The computing device of claim 1, wherein the data of the point cloud of the object comprises coordinates of each point in the point cloud, a mark of each point in the point cloud, and a total quantity of the points in the point cloud.

3. The computing device of claim 1, wherein a point in the point cloud is determined to be an adjacent point when the point is located inside a triangle of the curved surface.

4. The computing device of claim 1, wherein the neighborhood point is defined as a point which is connected to the marked adjacent point.

5. The computing device of claim 1, wherein the one or more programs further cause the at least one processor to: define a first predetermined value, a second predetermined value and a third predetermined value, the first predetermined value being greater than the second predetermined value, and the second predetermined value being greater than the third predetermined value.

6. The computing device of claim 5, wherein the marked adjacent point is used to simulate a plane surface when the type of the marked adjacent point is a surface type, and the type of the marked adjacent point is determined to be the surface type upon the condition that the calculated total quantity is greater than or equal to the first predetermined value.

7. The computing device of claim 5, wherein the marked adjacent point is used to simulate a conical surface when the type of the marked adjacent point is a line type, and the type of the marked adjacent point is determined to be the line type upon the condition that the calculated total quantity is less than the first predetermined value, and greater than or equal to the second predetermined value.

8. The computing device of claim 5, wherein the marked adjacent point is used to simulate a cylinder when the type of the marked adjacent point is an angle type, and the type of the marked adjacent point is determined to be the angle type upon the condition that the calculated total quantity is less than the second predetermined value, and greater than the third predetermined value.

9. The computing device of claim 5, wherein the type of the marked adjacent point is determined to be an isolated type upon the condition that the calculated total quantity is equal to the third predetermined value.

10. The computing device of claim 1, wherein the predetermined algorithm is selected from a group consisting of a triangulation algorithm, a least square method, a singular value decomposition (SVD) method, and a quaternion algorithm.

11. A computer-based method for processing point clouds using a computing device, the method comprising:
    retrieving data of a point cloud of an object;
    constructing a curved surface according to the point cloud and triangulating the curved surface using a plurality of triangles;
    calculating a distance between each two adjacent points located inside each triangle and marking the two adjacent points when the calculated distance is less than a predetermined distance value;
    connecting the marked adjacent points and generating a graphic structure of the point cloud of the object;
    determining neighborhood points corresponding to each marked adjacent point;
    calculating a total quantity of the neighborhood points corresponding to each marked adjacent point, and determining a type of the marked adjacent point according to the calculated total quantity;
    simulating each marked adjacent point and the neighborhood points to a predetermined surface using a predetermined algorithm according to the type of the marked adjacent point; and
    projecting each marked adjacent point onto the predetermined surface corresponding to the marked adjacent point to obtain a projected point according to the type of the marked adjacent point.

12. The method of claim 11, wherein the data of the point cloud of the object comprises coordinates of each point in the point cloud, a mark of each point in the point cloud, and a total quantity of the points in the point cloud.

13. The method of claim 11, wherein a point in the point cloud is determined to be an adjacent point when the point is located inside a triangle of the curved surface.

14. The method of claim 11, wherein the neighborhood point is defined as a point which is connected to the marked adjacent point.

15. The method of claim 11, further comprising:
defining a first predetermined value, a second predetermined value and a third predetermined value, the first predetermined value being greater than the second predetermined value, and the second predetermined value being greater than the third predetermined value.

16. The method of claim 15, wherein the marked adjacent point is used to simulate a plane surface when the type of the marked adjacent point is a surface type, and the type of the marked adjacent point is determined to be the surface type upon the condition that the calculated total quantity is greater than or equal to the first predetermined value.

17. The method of claim 15, wherein the marked adjacent point is used to simulate a conical surface when the type of the marked adjacent point is a line type, and the type of the marked adjacent point is determined to be the line type upon the condition that the calculated total quantity is less than the first predetermined value, and greater than or equal to the second predetermined value.

18. The method of claim 15, wherein the marked adjacent point is used to simulate a conical surface when the type of the marked adjacent point is a line type, and the type of the marked adjacent point is determined to be the line type upon the condition that the calculated total quantity is less than the first predetermined value, and greater than or equal to the second predetermined value.

19. The method of claim 15, wherein the type of the marked adjacent point is determined to be an isolated type upon the condition that the calculated total quantity is equal to the third predetermined value.

20. The method of claim 11, wherein the predetermined algorithm is selected from a group consisting of a triangulation algorithm, a least square method, a singular value decomposition (SVD) method, and a quaternion algorithm.

* * * * *